United States Patent
Oberzaucher et al.

(10) Patent No.: US 9,869,710 B2
(45) Date of Patent: Jan. 16, 2018

(54) DETERMINING INSULATION RESISTANCE FOR PHOTOVOLTAICS

(71) Applicant: Fronius International GmbH, Pettenbach (AT)

(72) Inventors: Friedrich Oberzaucher, Wels (AT); Gerhard Reiter, Laakirchen (AT)

(73) Assignee: FRONIUS INTERNATIONAL GMBH, Research Triangle Park, NC (US)

( * ) Notice: Subject to any disclaimer, the term of this patent is extended or adjusted under 35 U.S.C. 154(b) by 443 days.

(21) Appl. No.: 14/580,442

(22) Filed: Dec. 23, 2014

(65) Prior Publication Data

US 2015/0185272 A1  Jul. 2, 2015

(30) Foreign Application Priority Data

Dec. 27, 2013 (DE) .................. 10 2013 227 174

(51) Int. Cl.
*G01R 31/12* (2006.01)
*H02S 50/10* (2014.01)
*G01R 27/18* (2006.01)

(52) U.S. Cl.
CPC .............. *G01R 31/12* (2013.01); *G01R 27/18* (2013.01); *H02S 50/10* (2014.12)

(58) Field of Classification Search
CPC ...... G01R 31/12; G01R 31/2605; H02S 50/10
See application file for complete search history.

(56) References Cited

U.S. PATENT DOCUMENTS

2004/0174720 A1* 9/2004 Kurokami ......... H02M 7/53871
                                                        363/16
2007/0285074 A1* 12/2007 Maekawa ............. H02M 3/157
                                                        323/293

(Continued)

FOREIGN PATENT DOCUMENTS

DE    102011007222 A1 * 10/2012
DE    102013002018 A1    8/2014

OTHER PUBLICATIONS

German Patent Office; Office Action dated Aug. 22, 2014 for German Application No. 102013227174.3.

*Primary Examiner* — Giovanni Astacio-Oquendo
*Assistant Examiner* — Alvaro Fortich
(74) *Attorney, Agent, or Firm* — Michael G. Johnston; Moore & Van Allen, PLLC

(57) ABSTRACT

Method and device for determining an insulation resistance $R_{ISO}$ of a photovoltaic system (1) with respect to earth potential (EP), comprising a DC-DC converter unit (4) which converts a first DC voltage generated by the photovoltaic generator (2) into a second DC voltage which is applied to an intermediate circuit (5) that temporarily stores the electrical energy, supplied by the photovoltaic generator (2), for a DC-AC converter unit (6) connected thereto, wherein the intermediate circuit (5) contains a reference node (BK) having an adjustable reference potential (BP), and comprising a measuring unit (7) which picks up the measuring voltages between the reference potential (BP) and the earth potential (EP) at different reference potentials (BP), and an evaluation unit (8) which evaluates the measuring voltages that have been picked up in order to determine the insulation resistance of the photovoltaic generator (2) of the photovoltaic system (1).

18 Claims, 5 Drawing Sheets

(56) References Cited

U.S. PATENT DOCUMENTS

| | | | | |
|---|---|---|---|---|
| 2010/0145481 A1* | 6/2010 | Philipps | G01D 21/02 | 700/32 |
| 2011/0139213 A1* | 6/2011 | Lee | G05F 1/67 | 136/244 |
| 2011/0241549 A1* | 10/2011 | Wootton | F21S 8/006 | 315/117 |
| 2011/0285330 A1* | 11/2011 | Cewers | H02N 2/0075 | 318/116 |
| 2012/0200960 A1* | 8/2012 | Mueller | G01R 15/146 | 361/20 |
| 2012/0212184 A1* | 8/2012 | Klein | H01M 10/443 | 320/134 |
| 2012/0266945 A1* | 10/2012 | Letocart | H01L 31/02021 | 136/251 |
| 2013/0043880 A1* | 2/2013 | Bettenwort | H02H 3/337 | 324/509 |
| 2013/0082714 A1* | 4/2013 | Moell | G01R 31/025 | 324/509 |
| 2013/0088240 A1* | 4/2013 | Hofheinz | G01R 27/18 | 324/509 |
| 2013/0271888 A1* | 10/2013 | Falk | H02H 3/02 | 361/93.1 |
| 2013/0285670 A1* | 10/2013 | Yoshidomi | G01R 31/025 | 324/510 |

\* cited by examiner

DETERMINING INSULATION RESISTANCE FOR PHOTOVOLTAICS

The invention relates to a method and to a device for determining an insulation resistance of a photovoltaic system with respect to earth potential.

Photovoltaic systems are solar power systems which generate electrical energy from sunlight. In a photovoltaic system, solar cells are used to convert some of the insulation incident on the solar cells into electrical energy. A relatively large solar power system is also referred to as a solar power station. Photovoltaic systems can be connected to a power grid or function as solar power systems that are independent of the grid, said systems being permanently or temporarily disconnected from a public power grid. A photovoltaic system connected to a grid consists substantially of photovoltaic modules, one or more inverters, a protection device for automatic shutdown in the event of faults in the respective power grid, and a meter for detecting the amount of current fed into the power grid by the photovoltaic system. To feed the generated solar energy into the power grid, the direct current provided by the photovoltaic system has to be converted into alternating current. For this purpose, the inverter of the photovoltaic system converts the direct current supplied by the photovoltaic modules or photovoltaic generator into alternating current, the power values and voltage values of which are tailored to the respective power grid. In photovoltaic systems that are connected to the grid, line-commutated inverters are used which synchronise the generated alternating current with the power grid in question. The line-commutated inverters automatically perform the adjustment to predetermined parameters, in particular voltage values of the power grid.

Before an inverter starts the feeding operation and closes an associated grid relay, the photovoltaic generator is checked for potential insulation faults.

A photovoltaic system has a different potential from earth potential, both prior to connection to the grid and during the feeding operation. Therefore, it is necessary to insulate the photovoltaic system or photovoltaic generator with respect to earth potential, so that electrical currents that leak via earth from the photovoltaic system as a result of poor insulation do not cause any additional electrical losses. In addition, electrical currents of this type may pose a threat when touched. The earth current or leakage current as a whole is composed of portions of current from all the system components of the photovoltaic system, in particular photovoltaic modules, DC cables and inverters. With a given system voltage, this leakage current can be converted into an effective insulation resistance, which is also referred to as insulation resistance. In photovoltaic systems or photovoltaic generators, the insulation resistances of all the modules constitute a parallel circuit with respect to earth. In the case of inverters having no galvanic isolation between the grid and the photovoltaic generator, it is necessary to measure the insulation resistance at the generator before switching on the photovoltaic generator. The insulation resistance of the photovoltaic generator reduces as the photovoltaic system becomes larger and more photovoltaic modules are thus connected in parallel. In addition, the cables can be damaged, in particular by rodents biting the DC cables and the lines. The DC cables can also be damaged in other ways, for example by being squashed, by excess temperatures, or by the plastics sheaths becoming brittle.

It is thus necessary to monitor the insulation of the photovoltaic system in order to recognise physical damage, on one hand, and in order to protect people on the other hand. It should also be noted that whenever the operation of the photovoltaic system is interrupted, the photovoltaic system can no longer generate current.

FIG. 1 is a simple block diagram to illustrate a conventional photovoltaic system. The photovoltaic system shown comprises a photovoltaic generator PV which supplies a DC voltage that is converted by a DC-DC converter unit. The power yield of the photovoltaic system is increased by the DC to DC converter or the DC-DC converter unit. The DC-DC converter unit is connected to an intermediate circuit ZK, which temporarily stores the electrical energy, supplied by the photovoltaic generator, for a DC-AC converter unit connected thereto.

In a conventional photovoltaic system, the insulation resistance of the photovoltaic generator is measured against earth potential, the measuring circuit shown by way of example in FIG. 2 being used. If the insulation resistance $R_{ISO}$ measured by the measuring circuit falls short of a minimum value, which is for example prescribed according to a standard, a warning signal can be emitted and the inverter does not carry out any feeding operation. In the circuit shown in FIG. 2, the measuring voltage $U_{PE}$ forms the basis for determining the insulation resistance $R_{ISO}$ of the photovoltaic generator of the photovoltaic system. A signal relay $S_R$, which is connected in series with a resistor chain $R_P$, is used to change the test level in order to detect an insulation fault at the same potential as the reference potential (ground). In order to change the test level, the conventional measuring circuit shown in FIG. 2 thus requires a resistor chain provided for that purpose and a signal relay $S_R$ provided for that purpose.

A drawback of the device shown in FIG. 2 is thus that additional components or component parts have to be provided in order to measure the insulation resistance, in particular a resistor chain $R_P$ and the signal relay $S_R$. In addition to the additional technical complexity, the additional components, in particular the resistor chain $R_P$ and the signal relay $S_R$, represent a potential fault source. If for example the signal relay $S_R$ fails, the insulation resistance cannot be measured, and the inverter and thus the photovoltaic system as a whole cannot be switched into feeding operation.

Therefore, the object of the invention is to provide a device and a method for determining an insulation resistance of a photovoltaic generator of a photovoltaic system, which determine the insulation resistance in a technically simple and reliable manner.

This object is achieved according to the invention by a device having the features stated in claim 1.

The invention accordingly provides a device for determining an insulation resistance of a photovoltaic system with respect to earth potential, comprising:

a DC-DC converter unit which converts a first DC voltage generated by a photovoltaic generator into a second DC voltage, which is applied to an intermediate circuit that temporarily stores the electrical energy, supplied by the photovoltaic generator, for a DC-AC converter unit connected thereto, wherein the intermediate circuit contains a reference node having an adjustable reference potential, a measuring unit which picks up the measuring voltages between the reference potential and the earth potential at different reference potentials, and an evaluation unit which evaluates the measuring voltages that have been picked up in order to determine the insulation resistance of the photovoltaic generators of the photovoltaic system.

In one possible embodiment of the device according to the invention, in order that the measuring unit picks up a measuring voltage, the adjusted reference potential at the reference node of the intermediate circuit is changed in the event of a short-circuited photovoltaic generator.

In a further possible embodiment of the device according to the invention, in order that the measuring unit picks up a measuring voltage, the adjusted reference potential at the reference node of the intermediate circuit is changed in the event of a disconnected photovoltaic generator, in particular a photovoltaic generator disconnected by a disconnection switch.

In a further possible embodiment of the device according to the invention, the DC-DC converter unit comprises at least one controllable booster switch, which is operated in a clocked manner for charging the intermediate circuit.

In a further possible embodiment of the device according to the invention, the controllable booster switch of the DC-DC converter unit is closed by a sequence controller so that the measuring unit can pick up a measuring voltage.

In a further possible embodiment of the device according to the invention, the DC-DC converter unit comprises a two-pole voltage input for the DC voltage generated by the photovoltaic generator, which DC voltage is applied to the intermediate circuit by means of a coil and a booster diode.

In a further possible embodiment of the device according to the invention, the intermediate circuit comprises capacitors which are interconnected in series at the reference node.

In a further possible embodiment of the device according to the invention, the capacitors of the intermediate circuit which are interconnected at the reference node are charged during the clocked operation of the booster switch of the DC-DC converter unit.

In a further possible embodiment of the device according to the invention, the reference potential at the reference node of the intermediate circuit is adjusted by a discharge circuit connected to the intermediate circuit.

In a further possible embodiment of the device according to the invention, the discharge circuit comprises discharge resistors which are each arranged in parallel with the capacitors of the intermediate circuit and are connected in series to controllable discharge switches of the discharge circuit.

In a further possible embodiment of the device according to the invention, in order to change the reference potential at the reference node of the intermediate circuit, capacitors of the intermediate circuit are discharged, via the associated discharge resistors, by closing the corresponding discharge switches of the discharge circuit.

In a further possible embodiment of the device according to the invention, a sequence controller is provided which actuates the controllable booster switch of the DC-DC converter unit and/or actuates the discharge switches of the discharge circuit.

In a further possible embodiment of the device according to the invention, the measuring unit comprises a measuring operation amplifier having a two-pole differential voltage input for applying a differential voltage and an output for outputting to the evaluation unit the measuring voltage that has been picked up.

In a further possible embodiment of the device according to the invention, the output of the measuring operation amplifier is connected to a first pole of the two-pole differential voltage input of the measuring operation amplifier by means of a feedback resistor.

In a further possible embodiment of the device according to the invention, the first pole of the two-pole differential voltage input of the measuring operation amplifier of the measuring unit is connected to the earth potential, by means of a measuring resistor, in order to pick up a measuring voltage.

In a further possible embodiment of the device according to the invention, a reference voltage, which is generated by a reference voltage source, is applied to the second pole of the two-pole differential voltage input of the measuring operation amplifier of the measuring unit.

In a further possible embodiment of the device according to the invention, the evaluation unit compares the determined insulation resistance of the photovoltaic generator of the photovoltaic system with a predetermined threshold value, and generates an insulation fault warning signal if the determined insulation resistance of the photovoltaic generator falls short of the predetermined threshold value.

In a further possible embodiment of the device according to the invention, the DC-AC converter unit connected to the intermediate circuit is automatically disabled as a result of an insulation fault warning signal generated by the evaluation unit.

In a further possible embodiment of the device according to the invention, in order for the measuring unit to pick up a plurality of measuring voltages, a plurality of different reference potentials at the reference node of the intermediate circuit are adjusted sequentially by actuating the discharge circuit.

According to another aspect, the invention further provides a photovoltaic system comprising a device for determining an insulation resistance of a photovoltaic system with respect to earth potential, comprising
a DC-DC converter unit which converts a first DC voltage generated by a photovoltaic generator into a second DC voltage which is applied to an intermediate circuit that temporarily stores the electrical energy, supplied by the photovoltaic generator, for a DC-AC converter unit connected thereto,
wherein the intermediate circuit contains a reference node having an adjustable reference potential,
a measuring unit which picks up measuring voltages between the reference potential and the earth potential at different reference potentials, and
an evaluation unit, which evaluates the measuring voltages that have been picked up in order to determine the insulation resistance of the photovoltaic generator of the photovoltaic system.

The invention further provides a method for determining an insulation resistance of a photovoltaic system with respect to earth potential, having the features stated in claim 20.

The invention accordingly provides a method for determining an insulation resistance of a photovoltaic system with respect to earth potential, comprising the steps of:
applying a DC voltage, supplied by the photovoltaic system, to an intermediate circuit which temporarily stores the electrical energy generated by the photovoltaic system, wherein the intermediate circuit has a reference node having an adjustable reference potential;
picking up measuring voltages between the reference potential and the earth potential at different reference potentials; and
evaluating the measuring voltages that have been picked up in order to determine the insulation resistance of the photovoltaic system.

Possible embodiments of the device according to the invention and of the method according to the invention for determining an insulation resistance will be described in more detail in the following with reference to the accompanying figures, in which.

Figure 3:
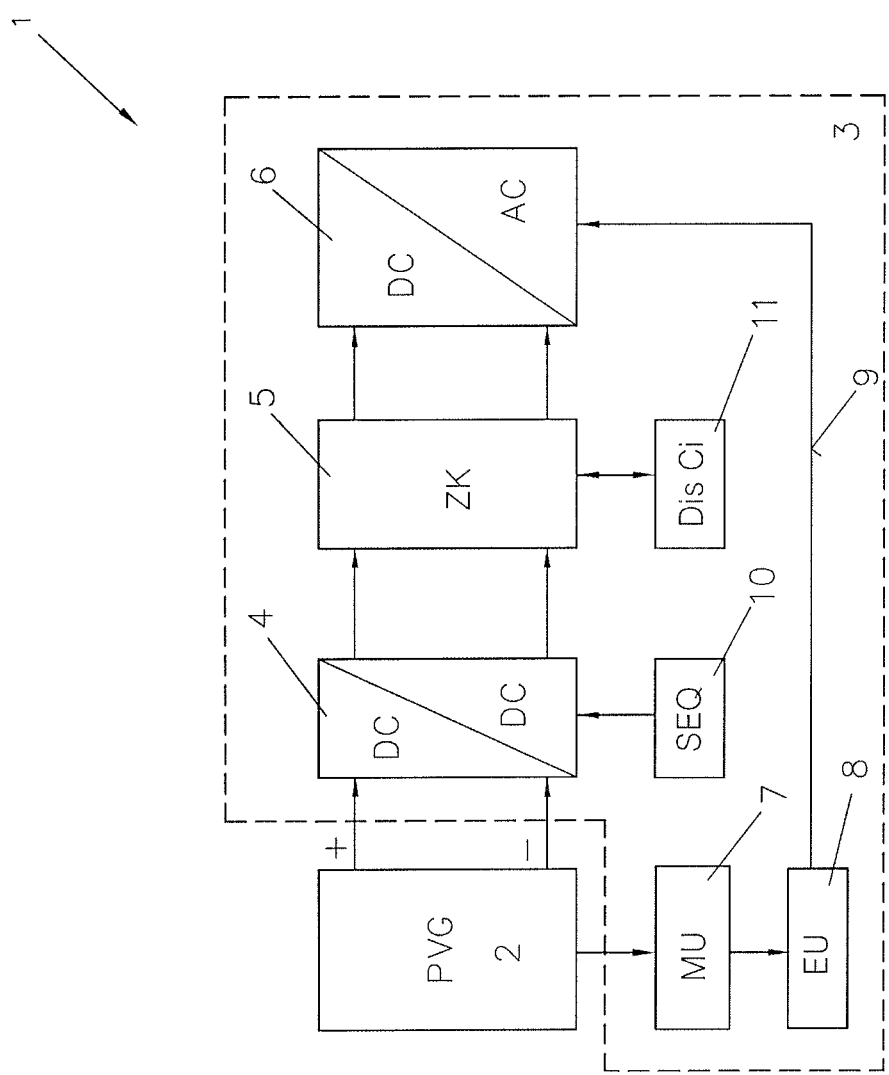
FIG. 3 is a block diagram of an embodiment of a device according to the invention for determining an insulation resistance.

As can be seen in FIG. 3, a photovoltaic system 1 comprises at least one photovoltaic generator 2 connected to an inverter 3. The inverter 3 contains a DC-DC converter unit 4, the input of which is connected to the photovoltaic generator 2. In one possible embodiment, there is an actuable disconnection switch between the photovoltaic generator 2 and the DC-DC converter unit 4 for disconnecting the photovoltaic generator 2. The DC-DC converter unit 4 converts a first DC voltage generated by the photovoltaic generator 2 into a second DC voltage, which is applied to an intermediate circuit 5 that temporarily stores the electrical energy, supplied by the photovoltaic generator 2, for a DC-AC converter unit 6, connected thereto, of the inverter 3. The DC to DC converter or DC-DC converter unit 4 increases the power yield of the photovoltaic generator 2. In the device according to the invention, the intermediate circuit 5 contains a reference node having an adjustable reference potential.

As shown in FIG. 3, the device 1 for determining the insulation resistance of the photovoltaic system 1 further contains a measuring unit 7 which picks up measuring voltages between the reference potential at the reference node of the intermediate circuit 5 and the earth potential at different reference potentials. The measuring unit 7 is connected to an evaluation unit 8 which evaluates the measuring voltages that have been picked up in order to determine the insulation resistance $R_{ISO}$ of the photovoltaic system 1. In one possible embodiment, the evaluation unit 8 compares the determined insulation resistance $R_{ISO}$ with a predetermined threshold value and generates an insulation fault warning signal if the determined insulation resistance of the photovoltaic system 1 falls short of the predetermined threshold value. The insulation fault warning signal can be fed to the DC-AC converter unit 6 via a line 9, the DC-AC converter unit 6 being automatically disabled as a result of the insulation fault warning signal received by the evaluation unit 8. In one possible embodiment, the DC-AC converter unit 6 is connected to a power grid and feeds the generated alternating current into the power grid.

In order for the measuring unit 7 to pick up a measuring voltage, the adjusted reference potential at the reference node of the intermediate circuit 5 is preferably changed in the event of a short-circuited photovoltaic input. In an alternative embodiment, in order for the measuring unit 7 to pick up a measuring voltage, the adjusted reference potential at the reference node of the intermediate circuit 5 is changed when the photovoltaic generator 2 is disconnected, this preferably taking place in that a disconnection switch provided between the photovoltaic generator 2 and the DC-DC converter unit 4 is opened. In one possible embodiment, the disconnection switch is opened by a sequence controller 10 provided in the inverter 3. The sequence controller 10 can be located within a controller of the inverter 3. In one possible embodiment, a microprocessor executes a corresponding sequence control program.

In one possible embodiment of the device 1 according to the invention, the DC-DC converter unit 4 comprises at least one controllable booster switch, which is operated in a clocked manner in order to charge the intermediate circuit 5. In order for the measuring unit 7 to pick up a measuring voltage, the controllable booster switch of the DC-DC converter unit 4 is closed by the sequence controller 10 in a controlled manner. The DC-DC converter unit 4 has a two-pole voltage input for the DC voltage generated by the photovoltaic generator 2. This DC voltage is preferably applied to the intermediate circuit 5 by means of a coil and a booster diode. In one possible embodiment, the controllable booster switch of the DC-DC converter unit 4 is wired in parallel with the two-pole voltage input of the DC-DC converter unit 4 and is actuated by the sequence controller 10. The intermediate circuit 5 comprises capacitors for storing energy which are interconnected in series at the reference node and are charged during the clocked operation of the booster switch of the DC-DC converter unit 4. In one possible embodiment, the reference potential at the reference node of the intermediate circuit 5 is adjusted by a discharge circuit 11 connected to the intermediate circuit. This discharge circuit 11 comprises discharge resistors which are each arranged in parallel with the capacitors of the intermediate circuit 5. These discharge resistors are preferably wired in series with controllable discharge switches of the discharge circuit 11. In order to change the reference potential at the reference node of the intermediate circuit 5, the capacitors of the intermediate circuit 5 are discharged by means of the associated discharge resistors by closing the corresponding discharge switches of the discharge circuit 11. The controllable booster switch of the DC-DC converter unit 4 and the discharge switches of the discharge circuit 11 are actuated by the sequence controller 10. In one possible embodiment to allow the measuring unit 7 to pick up a plurality of measuring voltages, a plurality of different reference potentials at the reference node of the intermediate circuit 5 are set sequentially by actuating the discharge circuit 11.

Figure 4:
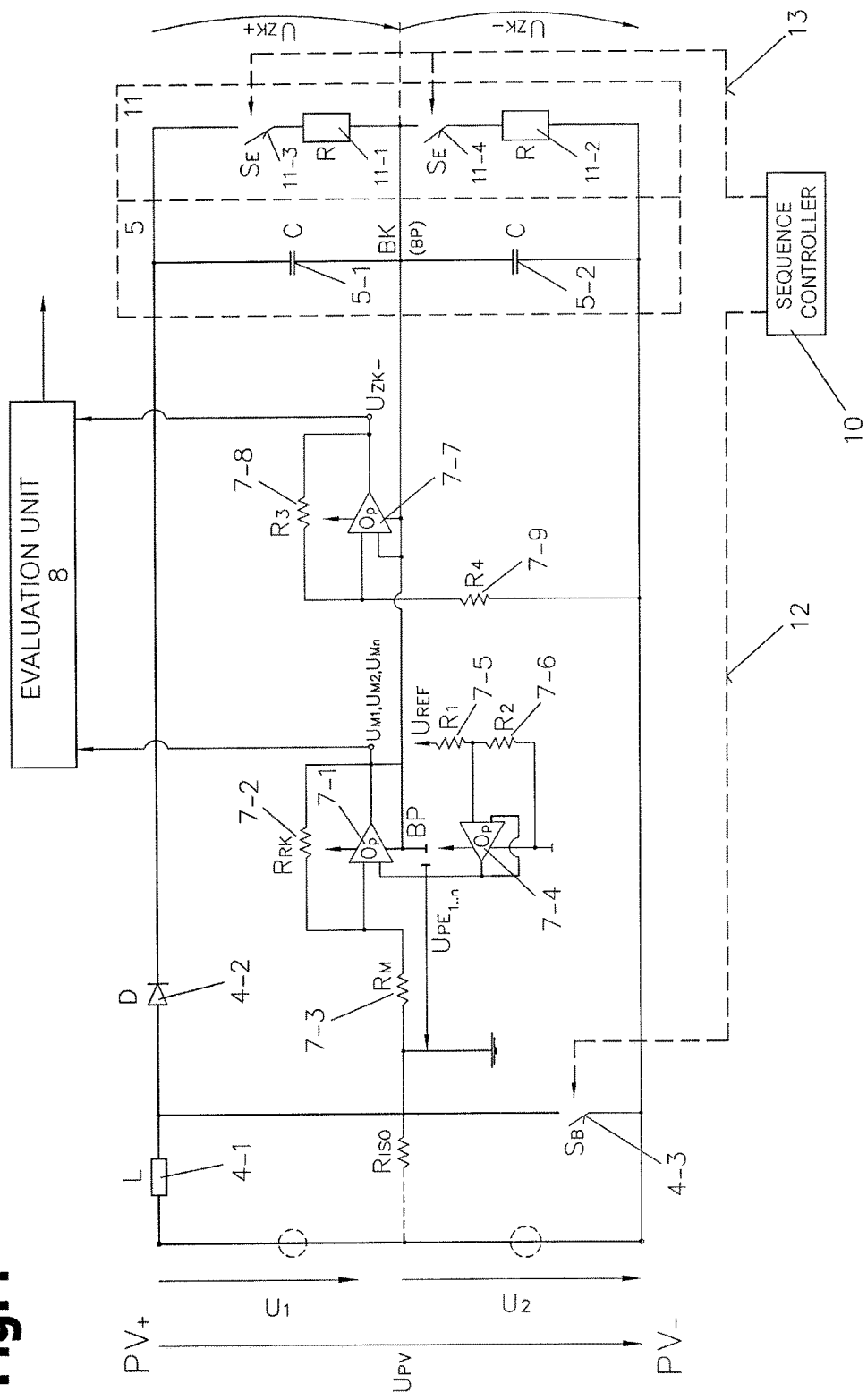
FIG. 4 is a circuit diagram to illustrate an embodiment of a device according to the invention for determining an insulation resistance.

FIG. 4 is a circuit diagram to illustrate one possible embodiment of the device 1 according to the invention for determining an insulation resistance $R_{ISO}$ of a photovoltaic system 1. As can be seen in FIG. 4, the DC-DC converter unit 4 of the inverter 3 comprises a two-pole voltage input for the DC voltage $U_{PV}$ generated by the photovoltaic generator 2. This DC voltage is applied to the intermediate circuit 5 by means of a coil 4-1 and a booster diode 4-2 of the DC-DC converter unit 4. As can be seen in FIG. 4, in the embodiment shown, the DC-DC converter unit 4 has a controllable booster switch 4-3 which is actuated by the sequence controller 10 via a control line 12. In order for the measuring unit 7 to pick up a measuring voltage, the controllable booster switch 4-3 of the DC-DC converter unit 4 is closed by the sequence controller 10. The booster switch 4-3 of the DC-DC converter unit 4 is wired in parallel with the two-pole voltage input of the DC-DC converter unit 4. In one possible embodiment, the booster switch 4-3 is a boost transistor which is actuated by the sequence controller 10. By changing the intermediate circuit voltage in the event of a short-circuited photovoltaic input, relatively high values of the change in the measured value can be obtained.

As can be seen in FIG. 4, in the embodiment shown, the intermediate circuit 5 contains capacitors 5-1, 5-2 which are charged during the clocked operation of the booster switch 4-3 of the DC-DC converter unit 4, and thus temporarily stores the electrical energy, supplied by the photovoltaic generator 2, for a DC-AC converter unit 6 connected to the intermediate circuit 5. As shown in FIG. 4, the two capacitors 5-1, 5-2 of the intermediate circuit 5 are interconnected at a reference node BK of the intermediate circuit 5.

The electrical potential applied to the reference node BK of the intermediate circuit 5 is an adjustable reference potential BP. In the embodiment shown in FIG. 4, the reference potential BP at the reference node BK of the intermediate circuit 5 is adjusted by a discharge circuit 11 connected to the intermediate circuit 5. The discharge circuit 11 comprises discharge resistors 11-1, 11-2 which are each arranged in parallel with the capacitors 5-1, 5-2 of the intermediate circuit 5. Controllable discharge switches 11-3, 11-4 are provided in series with the discharge resistors 11-1, 11-2. Said controllable discharge switches 11-3, 11-4 are actuated by the sequence controller 10 via control lines 13. In order to change the reference potential BP at the reference node BK of the intermediate circuit 5, the capacitors 5-1, 5-2 of the intermediate circuit 5 are discharged in part by means of the associated discharge resistors 11-1, 11-2 of the discharge circuit 11 by closing the corresponding discharge switches 11-3, 11-4. A first intermediate circuit voltage UZK+ is applied to the discharge resistor 11-1 and the associated discharge switch 11-3. Another intermediate circuit voltage UZK− is applied to the discharge resistor 11-2 and the associated discharge switch 11-4 which is wired in series therewith. By discharging one of the two capacitors 5-1, 5-2, the potential at the reference node BK is changed or set to a different level. As shown in FIG. 4, the measuring unit 7 of the inverter 3 picks up measuring voltages between the adjusted reference potential BP at the reference node BK of the intermediate circuit 5 and the earth potential EP. The voltage difference between the reference potential BP at the reference node BK of the intermediate circuit 5 and the earth potential EP of the ground/earth is denoted by $U_{PE}$ in FIG. 4.

The measuring unit 7 contains a measuring operation amplifier 7-1 having a two-pole differential voltage input for applying a differential voltage and having an output for outputting to the evaluation unit 8 the measuring voltage $U_M$ that has been picked up. The output of the measuring operation amplifier 7-1 is connected to a first pole of the two-pole differential voltage input of the measuring operation amplifier 7-1 via a feedback resistor 7-2. The first pole of the two-pole differential voltage input of the measuring operation amplifier 7-1 of the measuring unit 7 is connected, via a measuring resistor 7-3, to the earth potential EP in order to pick up a voltage $U_{PE}$. The insulation resistance $R_{ISO}$ to be picked up by the device is indicated symbolically in FIG. 4. A reference voltage generated by a reference voltage source is applied to a second pole of the two-pole differential voltage input of the measuring operation amplifier 7-1 of the measuring unit 7. The reference voltage source contains an operation amplifier 7-4 which is connected to a voltage divider containing two resistors 7-5, 7-6. As shown in FIG. 4, the measuring unit 7 contains an additional measuring operation amplifier 7-7, the output of which is connected to the evaluation unit 8. The output of the measuring operation amplifier 7-7 is fed back to a first pole of the differential voltage input of the measuring operation amplifier 7-7 via a resistor 7-8. As shown in FIG. 4, the second pole of the differential voltage input of the operation amplifier 7-7 is connected directly to the reference node BK of the intermediate circuit 5. The first pole of the differential voltage input of the measuring operation amplifier 7-7 is connected to a pole of the PV input via a resistor 7-9.

A plurality of measuring voltages $U_{M1}, U_{M2} \ldots U_{Mn}$ are measured sequentially by the first measuring operation amplifier 7-1 of the measuring unit 7 for different reference potentials BP at the reference node BK of the intermediate circuit 5. In order for the measuring unit 7 to pick up a plurality of measuring voltages, in one possible embodiment, a plurality of different reference potentials BP at the reference node BK of the intermediate circuit 5 can be adjusted sequentially by actuating the discharge circuit 11 accordingly. In one possible embodiment, an associated insulation resistance $R_{ISOi}$ is calculated by the evaluation unit 8 for each measuring voltage $U_{Mi}$. In one possible embodiment, the measuring unit 7 supplies n different measuring voltages $U_{M1}, U_{M2} \ldots U_{Mn}$. Accordingly, the evaluation unit 8 calculates n associated insulation resistances $R_{ISO1}, R_{ISO2} \ldots I_{SOn}$ for the various measuring voltages, and calculates on that basis the insulation resistance $R_{ISO}$ of the photovoltaic system 1 with respect to earth potential EP. In the device 1 according to the invention, the measuring unit 7 performs at least two measurements in order to pick up two different measuring voltages $U_M$ at different reference potentials BP at the reference node BK. The variation of the reference potential at the reference node BK can be increased by short-circuiting, during measurement, the photovoltaic input by means of a booster switch 4-3. This means that the intermediate circuit voltage can be selected and the resolution of the measurement is increased. Alternatively, the photovoltaic generator 2 can also be disconnected by opening a disconnection switch.

Figure 1:
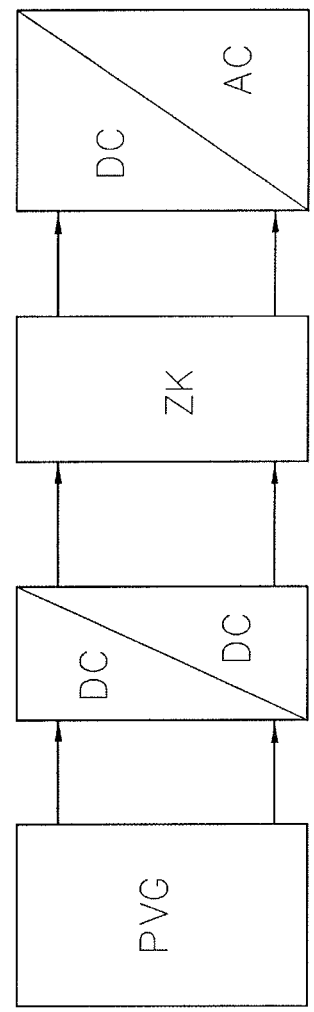
FIG. 1 is a block diagram to illustrate a conventional photovoltaic system.
Figure 2:
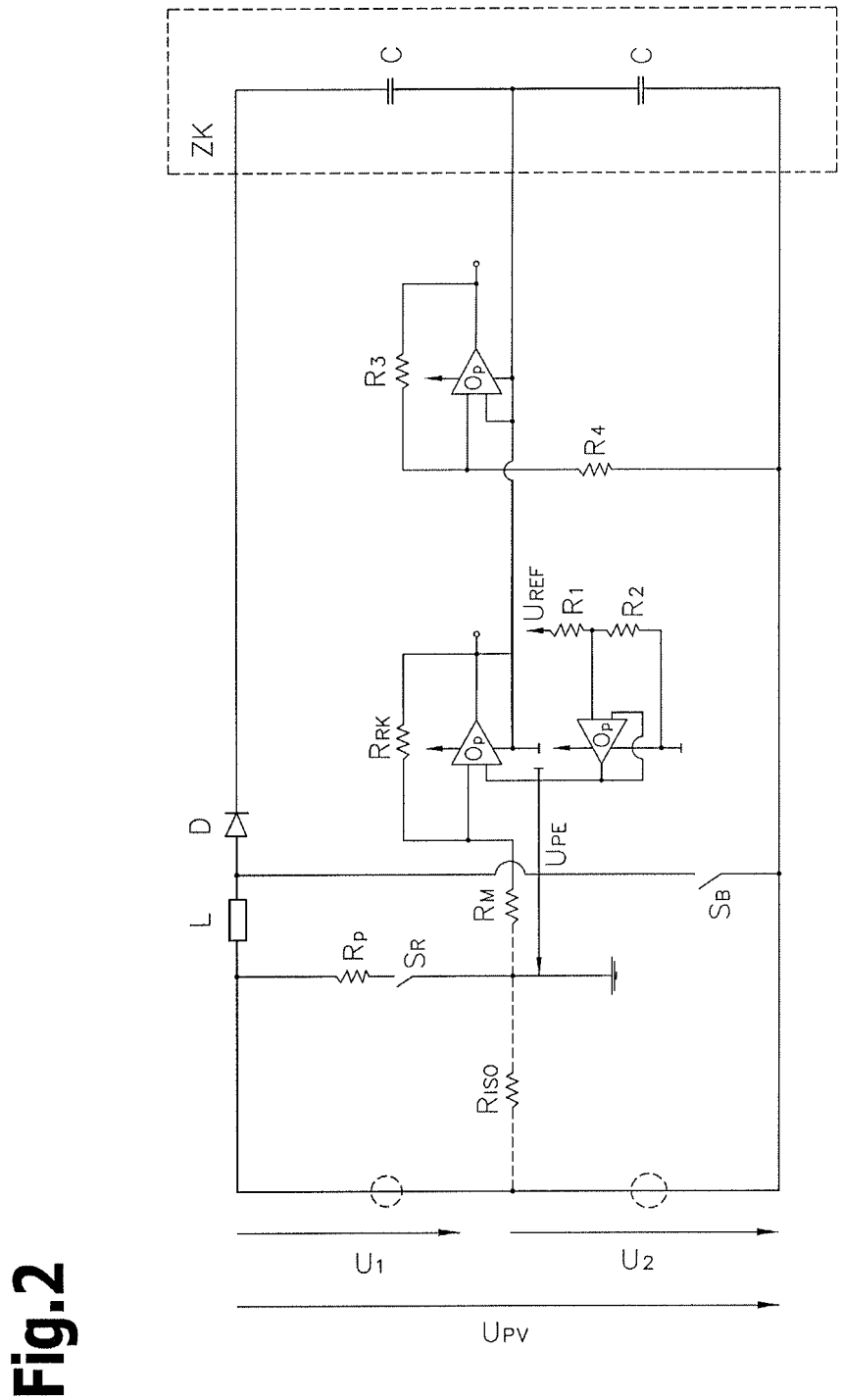
FIG. 2 is a circuit diagram to illustrate a conventional measuring circuit for measuring an insulation resistance of a photovoltaic system.

As can be seen by comparing the circuits in FIGS. 2 and 4, the device 1 according to the invention for determining the insulation resistance $R_{ISO}$ of the photovoltaic generator 2 does not require a signal relay $S_R$ having an associated resistor chain $R_P$. These two component parts are thus omitted in the device 1 according to the invention. As a result, the device 1 according to the invention is more reliable, since there is no risk of failure of or faults in the signal relay. In addition, the space for a signal relay on a circuit board of the inverter 3 is thus not needed. The device 1 according to the invention is therefore more robust against external influences whilst at the same time having less complex circuitry. In one possible embodiment, a photovoltaic current can additionally be checked for constancy in order to prevent incorrect measurements, in particular in the event of insulation changes.

In one possible embodiment, the insulation resistance $R_{ISO}$ is determined prior to the activation of the feeding operation, in which the inverter 3 feeds current into a power grid. If the resistance value of the determined insulation resistance $R_{ISO}$ falls short of a predetermined threshold value, the DC-AC converter unit 6 and thus the inverter 3 are preferably automatically disabled. In a further possible embodiment of the device 1 according to the invention, the insulation resistance is monitored continuously, even during the feeding operation of the inverter 3. In this embodiment, the insulation resistance is determined at regular intervals or when certain events occur. In the resistance value of the insulation resistance drops below an adjustable threshold value during the feeding operation, the inverter 3 is automatically switched off.

Figure 5:
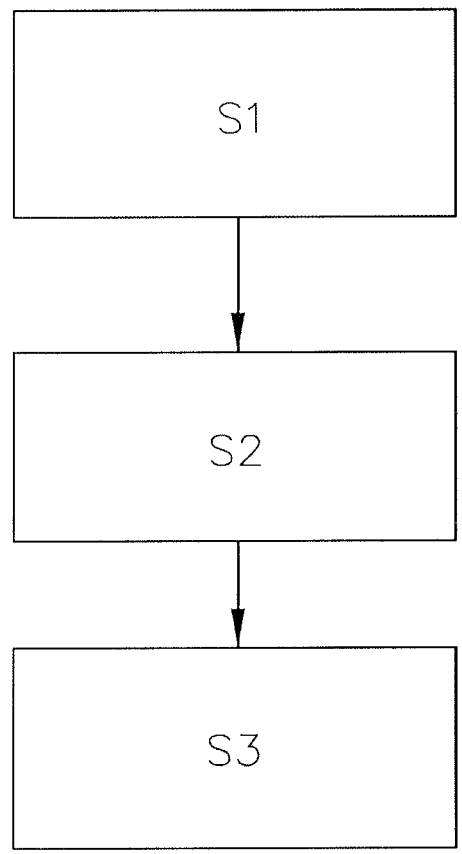
FIG. 5 is a flow chart to illustrate an embodiment of a method according to the invention for determining an insulation resistance.

FIG. 5 is a flow chart of one possible embodiment of a method according to the invention for determining an insulation resistance $R_{ISO}$, with respect to earth potential, in a photovoltaic system.

In a first step S1, a DC voltage supplied by the photovoltaic system 1 is applied to an intermediate circuit 5, which temporarily stores the electrical energy generated by the photovoltaic system 1, the intermediate circuit 5 having a reference node BK that has an adjustable reference potential.

In a further step S2, measuring voltages $U_M$ are picked up between the reference potential BP and the earth potential EP at different reference voltages.

In a third step S3, the measuring voltages that have been picked up are evaluated to determine the insulation resistance $R_{ISO}$ of the photovoltaic system or photovoltaic generator.

The method shown in FIG. 5 can be executed by a control program which is executed for example by a processor or controller within either the inverter 3 or a sequence controller 10. In one possible embodiment, said control program is located in a program register. In one possible embodiment, the control program is loaded from a database via a network connection by means of an interface of the inverter 3. In one possible embodiment, different control programs are provided for various inverter types and can be downloaded from the database. The control programs can be provided for different photovoltaic generators 2.

In one possible embodiment, the evaluation unit 8 and the sequence controller 10 can be integrated in a controller of the inverter 3. In one possible embodiment, the threshold values for the insulation resistance $R_{ISO}$ of the photovoltaic system 1 are programmable. In this embodiment, the threshold values of the control program for the insulation resistance are thus different for different photovoltaic generators 2. In one possible embodiment, the inverter 3 comprises a user interface, by means of which parameters of the photovoltaic system 1, in particular of the photovoltaic generator 2, can be input. In one possible embodiment, these parameters can be used to calculate a target insulation resistance $R_{ISO}$-TARGET of the photovoltaic system 1. In one possible embodiment, this target insulation resistance of the photovoltaic system 1 is compared with the insulation resistance $R_{ISO}$-CURRENT determined by the device according to the invention. If the difference ΔR between the target insulation resistance $R_{ISO}$-TARGET of the photovoltaic system 1 and the measured insulation resistance $R_{ISO}$-CURRENT of the photovoltaic system 1 exceeds a maximum permissible difference, the controller of the inverter 3 can establish that the connected photovoltaic system 1 is faulty or a photovoltaic generator 2 of the incorrect type has accidentally been connected to the inverter 3. In a further possible embodiment, the sequence controller 10 or the inverter controller automatically recognises the type of the connected photovoltaic generator 2 by reading a type ID from a data store attached to the photovoltaic generator 2.

LIST OF REFERENCE NUMERALS 1 photovoltaic system
2 photovoltaic generator
3 inverter
4 DC-DC converter unit
5 intermediate circuit
6 DC-AC converter unit
7 measuring unit
8 evaluation unit
9 control line
10 sequence controller
11 discharge circuit
12 control line
13 control line

The invention claimed is:

1. A device for determining an insulation resistance ($R_{ISO}$) of a photovoltaic system with respect to earth potential (EP), comprising
   a DC-DC converter unit which converts a first DC voltage generated by a photovoltaic generator into a second DC voltage, which is applied to an intermediate circuit that temporarily stores the electrical energy, supplied by the photovoltaic generator, for a DC-AC converter unit connected thereto, the DC-DC converter unit comprising at least one controllable booster switch operated in a clocked manner in order to charge the intermediate circuit;
   wherein the intermediate circuit contains a reference node (BK) having an adjustable reference potential (BP), and comprising
   a measuring unit, which picks up measuring voltages between the reference potential (BP) and the earth potential (EP) at different reference potentials (BP), and
   an evaluation unit which evaluates the measuring voltages that have been picked up in order to determine the insulation resistance of the photovoltaic generator of the photovoltaic system; and
   a discharge circuit connected to the intermediate circuit for adjusting the reference potential (BP) at the reference node (BK) of the intermediate circuit.

2. The device according to claim 1, wherein, in order that the measuring unit picks up a measuring voltage, the adjusted reference potential (BP) at the reference node (BK) of the intermediate circuit is changed in the event of the photovoltaic generator getting short circuited or disconnected.

3. The device according to claim 1, wherein the controllable booster switch of the DC-DC converter unit is closed by a sequence controller such that the measuring unit can pick up a measuring voltage.

4. The device according to claim 1, wherein the DC-DC converter unit comprises a two-pole voltage input for the DC voltage which is generated by the photovoltaic generator and is applied to the intermediate circuit by means of a coil and a booster diode.

5. The device according to claim 1, wherein the intermediate circuit comprises capacitors which are interconnected in series at the reference node (BK) and are charged during the clocked operation of the booster switch of the DC-DC converter unit.

6. The device according to claim 1, wherein the discharge circuit comprises discharge resistors which are each arranged in parallel with the capacitors of the intermediate circuit and are wired in series with controllable discharge switches of the discharge circuit.

7. The device according to claim 6, wherein, in order to change the reference potential (BP) at the reference node (BK) of the intermediate circuit, capacitors of the intermediate circuit can be discharged, via the associated discharge resistors, by closing the corresponding discharge switches of the discharge circuit.

8. The device according to claim 1, wherein a sequence controller is provided which actuates the controllable booster switch of the DC-DC converter unit and/or actuates the discharge switches of the discharge circuit.

9. The device according to claim 1, wherein the measuring unit comprises a measuring operation amplifier having a two-pole differential voltage input for applying a differential voltage and an output for outputting to the evaluation unit the measuring voltage that has been picked up.

10. The device according to claim 9, wherein the output of the measuring operation amplifier is connected to a first pole of the two-pole differential voltage input of the measuring operation amplifier by means of a feedback resistor.

11. The device according to claim 10, wherein the first pole of the two-pole differential voltage input of the measuring operation amplifier of the measuring unit is connected to the earth potential (EP) by means of a measuring resistor in order to pick up a measuring voltage.

12. The device according to claim 9, wherein a reference voltage, which is generated by a reference voltage source, is applied to the second pole of the two-pole differential voltage input of the measuring operation amplifier of the measuring unit.

13. The device according to claim 1, wherein the evaluation unit compares the determined insulation resistance ($R_{ISO}$) of the photovoltaic system with a predetermined threshold value and generates an insulation fault warning signal if the determined insulation resistance ($R_{ISO}$) of the photovoltaic generator falls short of the predetermined threshold value.

14. The device according to claim 13, wherein the DC-AC converter unit connected to the intermediate circuit is automatically disabled as a result of the insulation fault warning signal generated by the evaluation unit.

15. The device according to claim 1, wherein, in order for the measuring unit to pick up a plurality of measuring voltages, a plurality of different reference potentials (BP) at the reference node (BK) of the intermediate circuit are adjusted sequentially by actuating the discharge circuit.

16. A photovoltaic system comprising a device according to claim 1.

17. A method for determining an insulation resistance ($R_{ISO}$) of a photovoltaic system with respect to earth potential (EP), comprising the steps of:
(a) applying (S1) a DC voltage, supplied by the photovoltaic system, to an intermediate circuit which temporarily stores the electrical energy generated by the photovoltaic system, wherein the intermediate circuit has a reference node having an adjustable reference potential;
(b) adjusting the reference potential (BP) at the reference node (BK) of the intermediate circuit using a discharge circuit connected to the intermediate circuit;
(c) picking up (S2) measuring voltages between the reference potential (BP) and the earth potential (EP) at different reference potentials; and
(c) evaluating (S3) the measuring voltages that have been picked up in order to determine the insulation resistance ($R_{ISO}$) of the photovoltaic system.

18. A photovoltaic system comprising a device according to claim 6.

* * * * *

UNITED STATES PATENT AND TRADEMARK OFFICE
CERTIFICATE OF CORRECTION

PATENT NO. : 9,869,710 B2
APPLICATION NO. : 14/580442
DATED : January 16, 2018
INVENTOR(S) : Friedrich Oberzaucher and Gerhard Reiter It is certified that error appears in the above-identified patent and that said Letters Patent is hereby corrected as shown below:

On the Title Page

Item (73) Assignee:
Please change the Assignee's Residence to:
PETTENBACH (AT)

Signed and Sealed this
Seventeenth Day of July, 2018

Andrei Iancu
*Director of the United States Patent and Trademark Office*